United States Patent [19]

Niwa et al.

[11] Patent Number: 4,485,424
[45] Date of Patent: Nov. 27, 1984

[54] PROCESS AND CIRCUIT FOR EXCITING SOLENOID COIL

[75] Inventors: Hideo Niwa; Kozi Takahashi, both of Aichi, Japan

[73] Assignee: Sanmeidenki Kabushikikaisha, Japan

[21] Appl. No.: 426,415

[22] Filed: Sep. 29, 1982

[30] Foreign Application Priority Data

Jun. 9, 1982 [JP] Japan .................................. 57/99074

[51] Int. Cl.³ .............................................. G01F 1/58
[52] U.S. Cl. .................................... 361/152; 361/160; 307/132 E
[58] Field of Search ....................... 361/139, 152, 160; 307/132 E

[56] References Cited

U.S. PATENT DOCUMENTS

| | | | |
|---|---|---|---|
| 3,218,484 | 11/1965 | Matusche | 361/139 X |
| 3,307,824 | 3/1967 | Weisheit | 361/139 X |
| 4,148,090 | 4/1979 | Kawai et al. | 361/152 |
| 4,204,240 | 5/1980 | Schmoock | 361/152 |
| 4,370,604 | 1/1983 | Griffin | 361/152 X |

Primary Examiner—A. D. Pellinen
Assistant Examiner—Derek Jennings
Attorney, Agent, or Firm—William A. Drucker

[57] ABSTRACT

A process and circuit arrangement for exciting a solenoid coil to operate an iron core. Power from an AC power source is full-wave rectified, and then allowed to flow to a solenoid coil by a switch element located between the full-wave rectification circuit and the solenoid coil, which coil is made electrically conductive only for each short period of time corresponding to the top and its vicinities of the voltage wave-form of the rectified power so that the current is allowed to flow to the solenoid coil. Therefore, no current flows to the solenoid for each period of time corresponding to the trough and its vicinities of voltage wave-form of the rectified power. Thus, excitation and non-excitation of the solenoid is continuously alternated to give a dither effect to the iron core associated with the solenoid coil.

7 Claims, 19 Drawing Figures

FIG.1
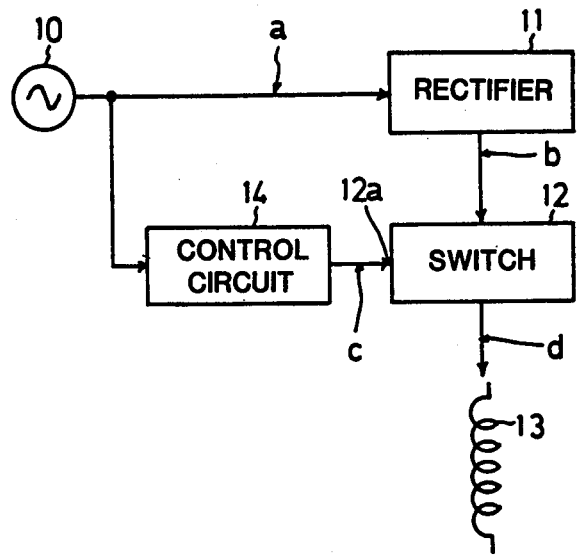
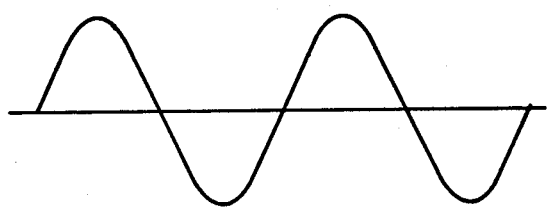
FIG. 2a
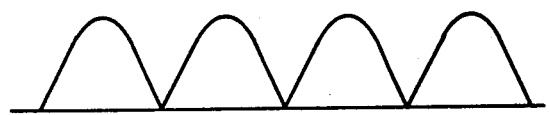
FIG. 2b
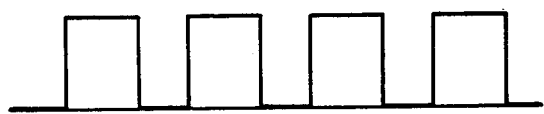
FIG. 2c
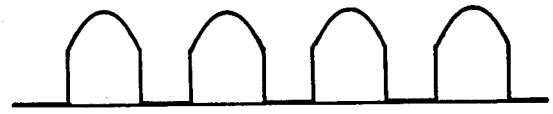
FIG. 2d

PROCESS AND CIRCUIT FOR EXCITING SOLENOID COIL

BACKGROUND OF THE INVENTION

1. Field of the Invention

This invention relates to a process and circuits for exciting a solenoid coil by supplying the current with rectified AC power, and particularly relates to a process and circuits for exciting a solenoid coil by making an intermittent supply of rectified power to the coil so that the coil gives a dither effect to an iron core used in association with the coil.

2. Description of the Prior Art

Heretofore a solenoid coil has been energized as follows: AC power is rectified, and is made into the complete form of direct current by using a smoothing ciruit of a large scale. Then the current is intermittently supplied to a solenoid coil through a switch circuit which conducts the current at regular intervals. By following such a conventional method, the coil is intermittently energized in full measure by a sufficient voltage so that the coil is given a sufficiently great magnetic force, thus operating its associated iron core with a great force while giving the core a satisfactory dither effect. However, in such a method, if no smoothing citcuit is available, pulsating current is supplied to the coil. And if the switch circuit is conductive when the voltage is lowered by a pulsating portion of the current, the lowered voltage is applied to the coil so that only a lowered magnetic force is given thereto. Thus such a method can make possible the satisfactory performance of the coil only when a smoothing circuit of a large scale is used as an essential requirement.

SUMMARY OF THE INVENTION

It is an object of the invention to provide a process and circuit for exciting a solenoid coil by energizing the coil intermittently, or at short regular intervals so as to give an iron core a satisfactory dither effect.

Another object of the invention is to provide a process and circuit for exciting a solenoid coil which is characterized in applying a sufficiently high voltage of the top and its vicinities of the voltage wave-form of full-wave rectified AC power to the coil so that the coil is given a sufficiently great magnetic force, thus operating an iron core associated with the coil with a sufficiently great force.

A still another object of the invention is to provide a process and circuit for exciting a solenoid coil by energizing the coil at short regular intervals and with a sufficiently great force without using any conventional smoothing circuit, so that the coil-energizing circuit is made more simple.

That is, according to the inevntion, a solenoid coil is not energized for each period of time corresponding to the trough and its vicinities of the voltage wave-form of full-wave rectified AC power (which section has been required to be stopped up in the prior art) so that a dither effect is produced. Therefore, it is not necessary to smooth the foregoing section of of the voltage waveform.

Other objects and advantages of the invention will become apparent during the following discussion of the accompanying drawings.

BRIEF DESCRIPTION OF THE DRAWINGS

FIG. 1 is a block diagram of a solenoid-coil exciting circuit;

FIGS. 2a–2d shows the wave-forms of signals produced by the circuit of FIG. 1;

DESCRIPTION OF THE PREFERRED EMBODIMENTS

Figure 3:
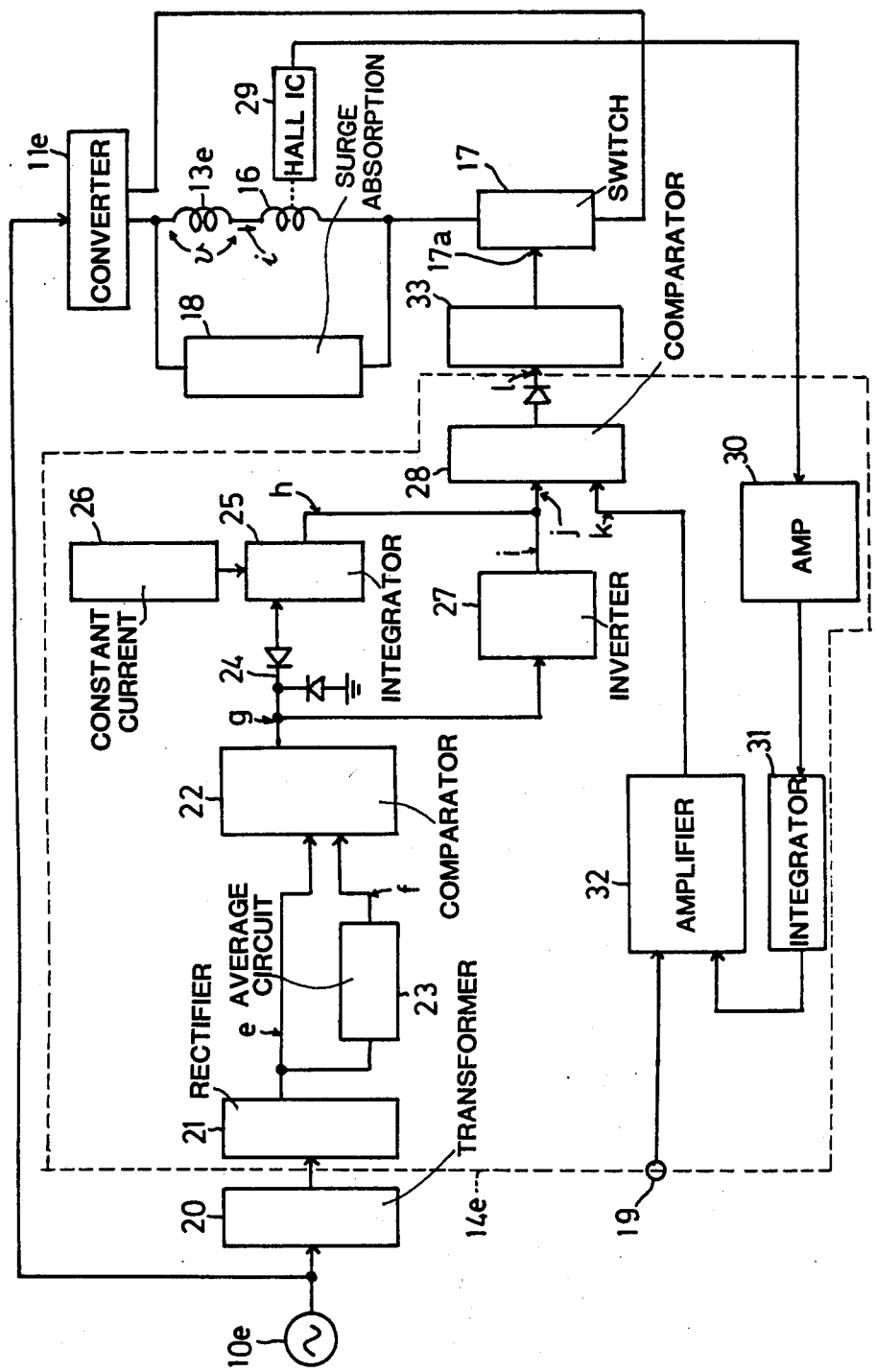
FIG. 3 is a block diagram of another solenoid-coil exciting circuit.

Referring to FIG. 1, numeral 10 designates a power source which is usually the same as an AC power source for commercial use employed in factories or the like. A circuit 11 is connected to the power source 10 so as to fullwave rectify the power from the source 10. For example, a bridge rectifier circuit may be used as the full-wave rectification circuit 11. A solenoid coil 13 is connected to the output side of the circuit 11 through a switch element 12. This element 12 has a control terminal 12a and is adapted to allow the output from the circuit 11 to pass therethrough to come to the solenoid 13 or to prevent the same output from passing therethrough in accordance with signals supplied to the control terminal 12a. For example, a transistor or GTO (gate turn-off thyristor) may be used as the switch element 12. The solenoid coil 13 is of such a type as employed for operating the movable iron core of an electromagnetic valve used in a hydraulic device or of other kind of magnetic device for mechanical operation. Not only the converter circuit 11 but a control circuit 14 is connected to the power source 10. The control circuit 14 has an output connected to the control terminal 12a of the switch element 12. The control circuit 14 is adapted to give the switch element 12 a signal to make the same element 12 electrical conductive at the same time when the alternating current is supplied from the power source 10.

Referring to FIG. 2, the foregoing arrangement is operated as follows: The source 10 supplys such AC power as shown in a to the converter circuit 11, wherein the current is full-wave rectified so that the circuit 11 supplys the switch element 12 with an output of power with such a waveform of voltage as shown in b. The control circuit 14 supplyd the switch element 12 with an output of such a control signal as shown in c.

This control signal is such that its value of voltage remains zero for a short period of time from the start of one cycle of the voltage waveform b of the rectified power, namely, when the voltage value of the power b is zero or located at the trough of a wave, but becomes a sufficient one for making the switch element 12 electrically conductive when the voltage value of the power b is increased in full measure (i.e., for a period of time corresponding to the top portion of the wave-form of the power voltage b), and again drops to zero as the voltage value of the power b starts to lower to zero. Such a signal is repeatedly emitted from the control circuit 14 at the same time when the full-wave rectified power is output from the converter circuit 11. When such a control signal c is given to the control terminal 12a of the switch element 12, the same element 12 is made electrically conductive so as to allow the power from the converter circuit 11 to pass therethrough to flow to the solenoid coil 13, so that such a voltage as shown in d is applied to the coil 13; that is, the voltage is applied to the coil 13 only for each period of time corresponding to the top portion (to be more exact, top portion and its vicinities) of the wave-form b. Therefore, the coil 13 is excited at short regular intervals, in other words, excitation and non-excitation of the coil 13 are alternated every time the AC power from the source 10 passes through one half of its cycle. When such a coil 13 is used in association with an iron core in an electromagnetic device, it will give the core a satisfactory dither effect so as to operate the core with a high degree of accuracy.

FIG. 3 illustrates another arrangement for exciting a solenoid coil (or proportional solenoid) whereby the coil is supplied with electric current with the strength corresponding to the value of a command signal so that the coil gives its associated core (not shown) a mechanical force corresponding to the value of the current. In this arrangement, a solenoid coil 13e (similar to the preceding one), a coil 16 for detecting the current flowing through the solenoid coil 13e, and a transistor 17 (as a switch element) are connected to the output side of a full-wave rectification circuit 11e (similar to the preceding one) in series. A surge-absorption circuit 18 (of the well-known type in the art) is connected to both coils 13e and 16. A control circuit 14e is provided with a terminal 19 through which to input signals to control the current flowing through the solenoid coil 13.

In the second arrangement, a portion of the current supplied from an AC power source 10e (similar to the preceding one) is allowed to flow into a full-wave rectification circuit 21 through a transformer 20 electrically isolating the power source 10e from the control circuit 14e, so that that portion of the current is full-wave rectified therein. The signal full-wave rectified in the circuit 21 has such a wave-form as shown in e of FIG. 4. Incidentally, the wave-forms of signals passing through the portions indicated by the alphabetical letters e to l in FIG. 3, that of the voltage v applied to the solenoid coil 13e, and that of the current i flowing through the same coil 13e are all indicated by the same letters in FIG. 4; therefore, the description of the circuit arrangement of FIG. 3 is to be read by reference to FIG. 4.

A certain portion of the signal full-wave rectified in the circuit 21 is sent to a comparison circuit 22, while the remaining portion of the signal is supplied to an average-value circuit 23. This circuit 23 outputs and sends an average-value signal f to the comparison circuit 22. Supplied with the signals from both circuits 21 and 23, the comparison circuit 22 outputs a signal with such a rectangular wave-form g as projects to the plus side when the voltage value of the full-wave rectified signal is greater than that of the average-value signal, but to the minus side when the former value is smaller than the latter one. This signal is sent to an integration circuit 25 through a discharge circuit 24 comprising a combination of diodes. The circuit 25 is adapted to integrate the electric charge supplied thereto from a constant-current circuit 26 when the output voltage of the comparison circuit 22 is of a plus value, while the same circuit 25 discharges the integrated charge through the circuit 24 when the foregoing output voltage is of a minus value; therefore, the output signal from the integration circuit 25 has such a wave-form as shown in h of FIG. 4. The comparison circuit 22 also sends a signal (having the wave-form g) to an inversion circuit 27 which is adapted to invert the foregoing signal and output a signal i, namely, the inverted signal from which the minus side of its wave-form has been removed. The signal h output from the integration circuits 25 and that output from the inversion circuit 27 are so mixed as to provide such a signal as shown in j of FIG. 4. And this signal j is sent to another comparison circuit 28.

Figure 4:
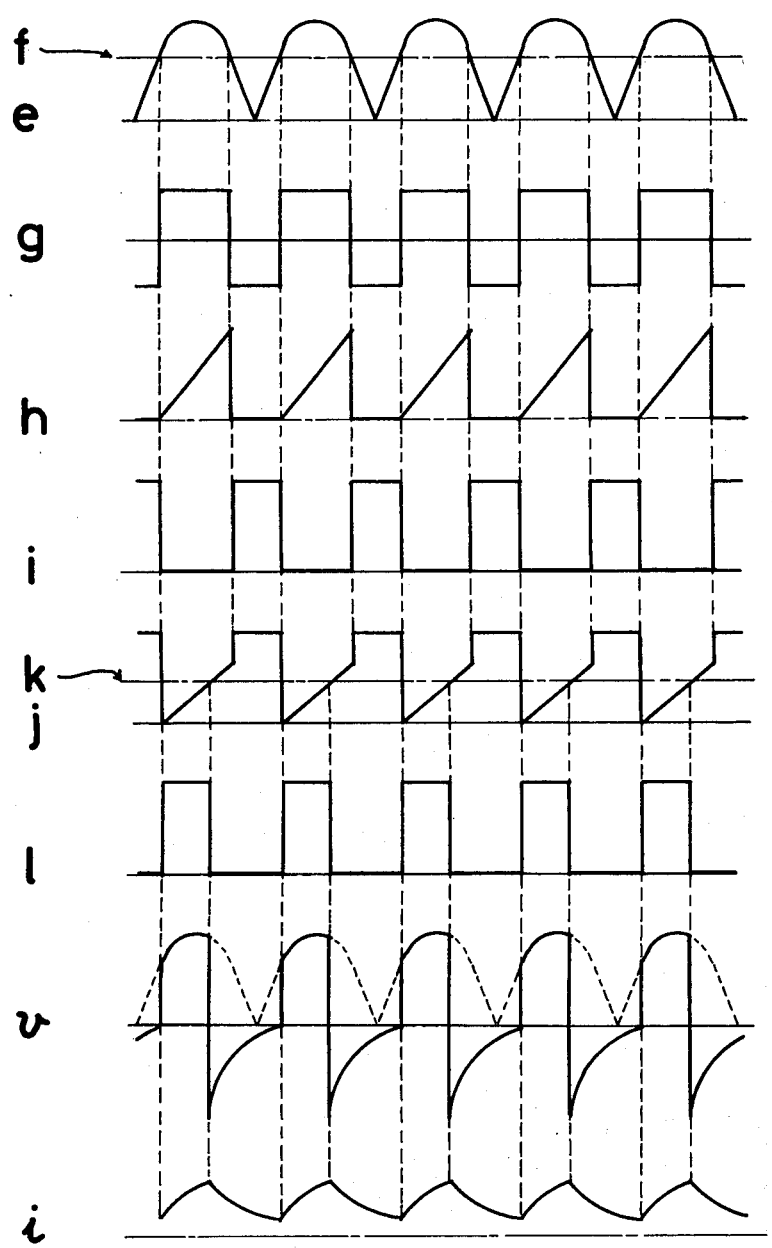
FIGS. 4 to 7 show the wave-forms of different signals to explain the operation of the circuit of FIG. 3.

The input signal 19 is supplied with a DC command signal. This signal is sent to the comparison circuit 28 after its error has been corrected (as described later) in an error-amplifying circuit 32. When the comparison circuit 28 is supplied with both signal j and corrected signal k, the same circuit 28 produces a signal with such a rectangular wave-form as projects to the plus side when the value of signal k is greater than that of signal j, but to the minus side when the former value is smaller than the latter one. The signal produced by the circuit 28 is not output in its entire form, but only its plus side shown in l is emitted through a diode 28a to provide the output signal of the control circuit 14e. This output signal l from the circuit 14 is sent to a control terminal (base) 17a of a transistor 17 through a photoisolator 33 for preventing direct current from flowing between the transistor 17 and the control circuit 14e. The transistor 17 is thus made electrically conductive, and the power rectified in the circuit 11e and passed the transistor 17 is given such a wave-form of voltage as shown in v of FIG. 4. And such a voltage v is applied to the solenoid coil 13e so that such a current as shown in i of FIG. 4 is allowed to flow through the same coil 13e. Thus the coil 13e is excited at short regular intervals as in the preceding embodiment, in other words, excitation and non-excitation of the coil are alternated every time the AC power from the source 10e passes through one half of its cycle; therefore, when such a coil 13e is used in association with an iron core in an electromagnetic device, it will give the core a satisfactory dither effect so as to operate the core with a high degree of accuracy. As in the preceding embodiment, the voltage from the full-wave rectification circuit 11e is applied to the solenoid coil 13e only for each period of time corresponding to the top portion of the wave-form shown in e of FIG. 4; however, as also shown in v of FIG. 4, when the voltage is not in the top portion of its wave-form, a voltage with the opposite polarity to that of the voltage from the circuit 11e is applied to the coil 13e because of the presence of the surge-absorption circuit 18. Also, when the voltage is not in the top portion of its wave-form, a current with the same polarity (as that of the current flowing through the coil 13e when the voltage is in the top portion of its wave-form) flows through the coil 13e. However, if the surge-absorption circuit 18 is set at a suitable value, such extraneous voltage and current have no adverse effect on the dither effect given by the coil The current from the transistor 17 also flows through the coil 16. A Hall IC 29 is magnetically combined with the coil 16 so that the former 29 detects the value of current flow through the solenoid coil 13e. The signal detected by the Hall IC 29 is amplified by a circuit 30, integrated by another circuit 31, and sent to the error-amplyfying circuit 32 wherein the foregoing signal corrects an error of a command signal sent from the input terminal 19, as is well known in the art, so that the current supplied to the solenoid coil 13e has an exact value as required.

In the arrangement of FIG. 3, not only the power source 10e and the control circuit 14e are electrically isolated from each other by the transformer 20, but also the circuit for energizing the coil 13e (namely, one comprising the rectification circuit 11e, transistor 17, and the like) and the control circuit 14e are electrically isolated from each other by the photoisolator 33 and the Hall IC 29; therefore, the voltage in the solenoid-energizing circuit, namely, high voltage in the power source (10e) for commercial use, is prevented from being accidentally applied to the command-signal input terminal 19. Accordingly, when the earthing circuit of the device which gives the command signal to the input terminal 19 is grounded (according to the usual practice), the device is not damaged and no erroneous control of the energization of the solenoid coil is made.

Figure 5:
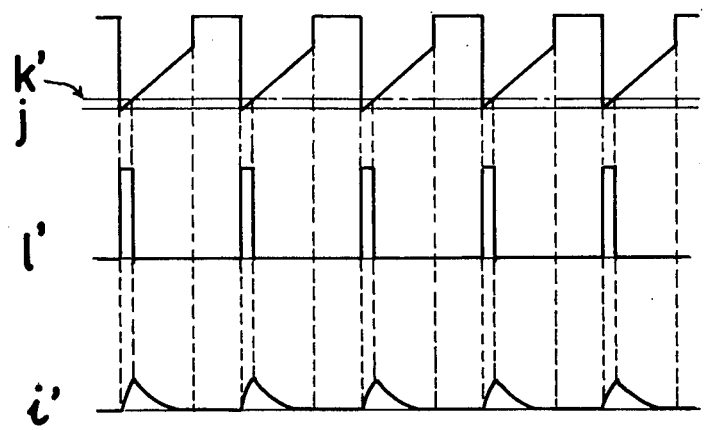

When the command signal sent to the error-amplifying circuit 32 is of such a small value as causes the same circuit 32 to output such a small signal as shown in k' of FIG. 5, the comparison circuit 28 outputs a signal with a wave-form shown in l' of FIG. 5 so that such a current as shown in i' of FIG. 5 flows through the solenoid coil 13e, thus operating its associated iron core with a smaller force.

Figure 6:
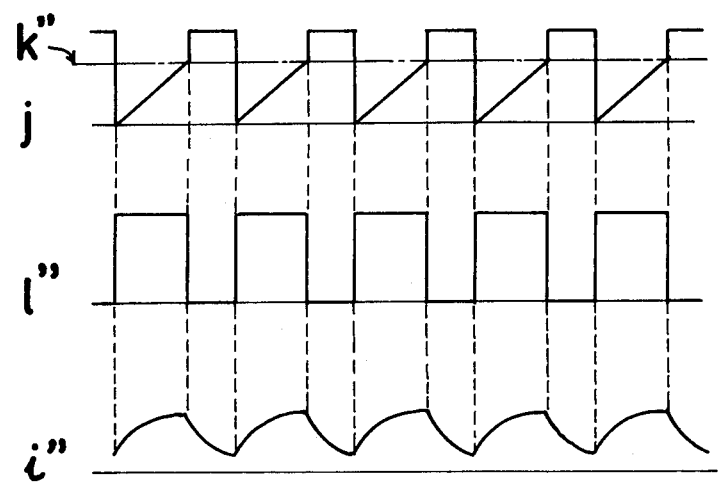

When the command signal sent to the amplifier circuit 32 is of such a greater value as causes the same circuit 32 to output such a large signal as shown in k" of FIG. 6, the comparison circuit 28 outputs a signal with a wave-form shown in l" of FIG. 6 so that such a current as shown in i" of FIG. 6 flows through the solenoid coil, thus operating its associated iron core with a great force.

If the output signal from the amplifier circuit 32 is of a value larger than k", the width of a pulse of the output signal from the comparison circuit 28 is not greater than that shown in l" because the other signal sent to the comparison circuit 28 is of such a wave-form as shown in j of FIG. 4. Therefore, the supply of the power from the full-wave rectification circuit 11e to the solenoid coil 13e is certainly interrupted for each period of time corresponding to the trough portion of the wave-form of the output from the converter circuit 11e. Thus, in such a case, a dither effect is certainly produced as in the preceding cases.

Figure 7:
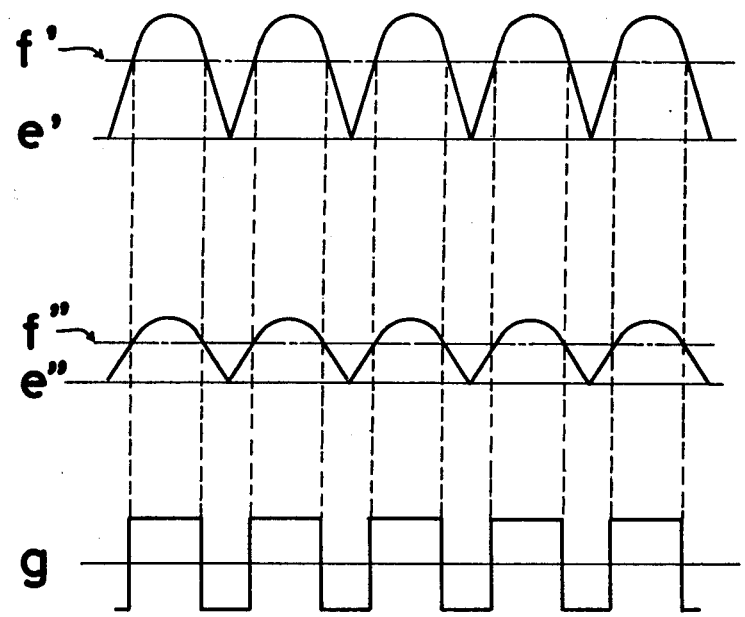

FIG. 7 reveals an advantage provided by the presence of the average-value circuit 23: The output boltage from the full-wave rectification circuit 21 becomes higher or lower as shown in e' and e" of FIG. 7 in proportion to the value of voltage of the power source 10e. Similarly, the output voltage from the average-value circuit 23 becomes higher or lower as shown in f and f" of FIG. 7 in proportion to the same value. Therefore, the output signal g from the comparison circuit 22 is always of the same width of pulse irrespective of increase or decreases in the value of voltage of the power source 10e, so that the interruptions of the energization of the solenoid coil 13e may be certainly made irrespective of any variations of the voltage of the power source 10e.

If the voltage of the power source 10e is only subjected to negligible variations or there is no need to prevent variations of the same voltage from having an effect on the energization of the solenoid coil 13e, no average-value circuit such as 23 may be provided, but the reference signal of a certain voltage, e.g., the voltage signal within a range of 50 to 80 percent of the wave height of the output voltage from the converter circuit 21, instead of the average-value signal f, may be given to the comparison circuit 22.

Figure 8:
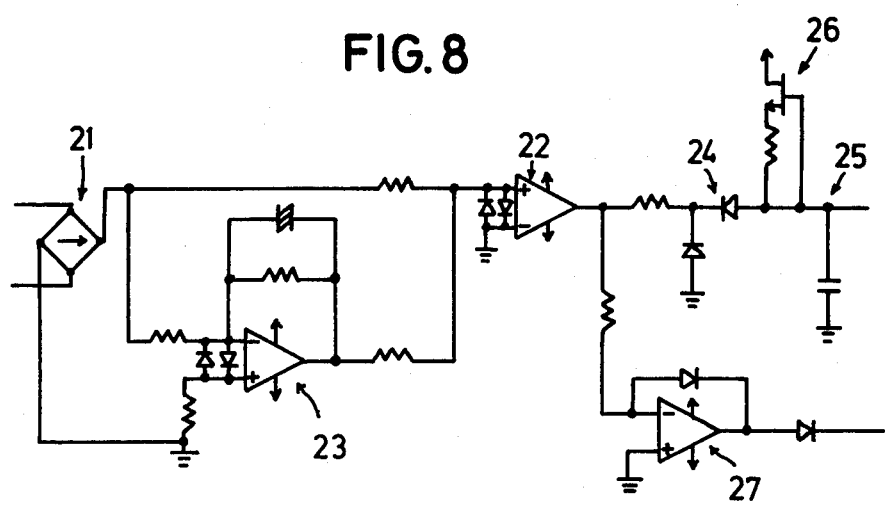
FIG. 8 is a detailed view of the arrangement of a portion of the circuit shown in FIG. 3.
Figure 13:
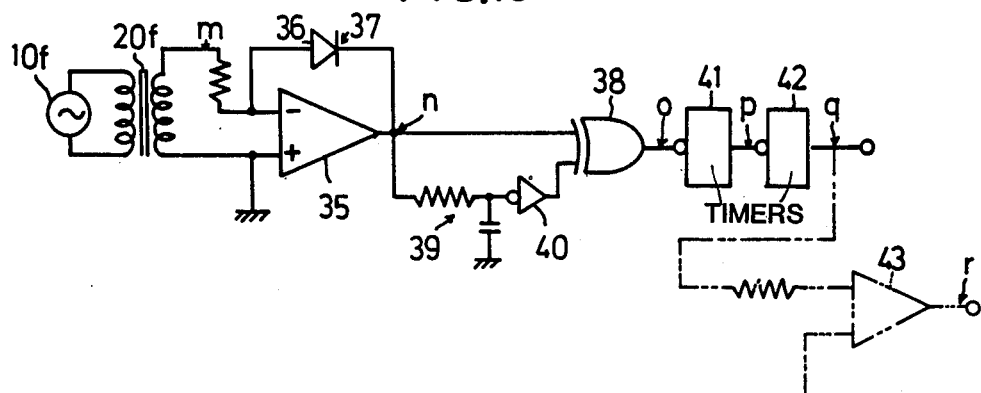
FIG. 13 is a block diagram of a control circuit which may be used for the circuit arrangement of FIG. 1 or 3.

FIG. 8 illustrates one example of a detailed arrangement of the portion of the circuit construction shown in FIG. 13 which includes the comparison circuit 22, average-value circuit 23, and inversion circuit 27. In this arrangement, an operational-amplifier circuit, transistor, diodes, resistors, and condenser are provided as indicated by symbols.

Figure 9:
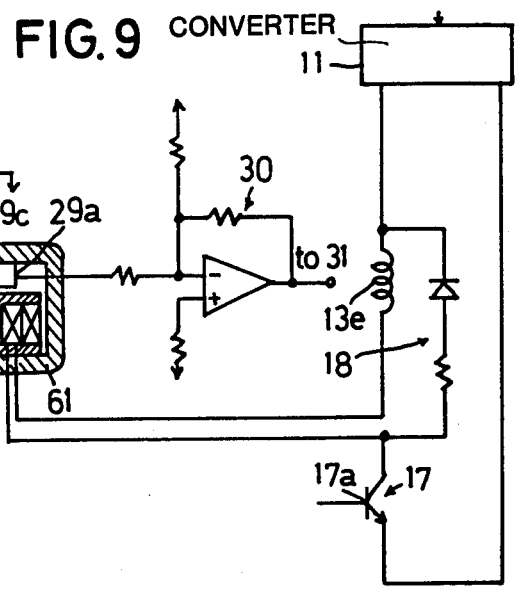
FIG. 9 shows a means for detecting a current flow through a solenoid coil.

FIG. 9 shows one example of a detailed arrangement of the portion of the circuit construction shown in FIG. 3 which is designed to detect the current flowing through the solenoid coil 13e. In this arrangement, numeral 61 designates a yoke, and a core 62 is fixed in the yoke wall at its one end. The yoke 61 and core 62 both are of magnetic material. Numeral 63 designates a bobbin around which the current-detecting coil 16 and a coil 64 for impressing a biasing magnetic field are wound. The Hall IC 29 is located between one arm of the yoke 61 and the core 62. The Hall IC 29 has an output terminal 29a connected to an amplifier circuit 30 and a pair of terminals 29b and 29c connected to a power circuit (not shown) so as to be supplied with an operating power (e.g., of 5 volts) therefrom. The construction comprising the current-detecting coil 16, Hall IC 29, and biasing-magnetic-field impressing means 64 may be herein referred to as a "current-detecting means".

Figure 10:
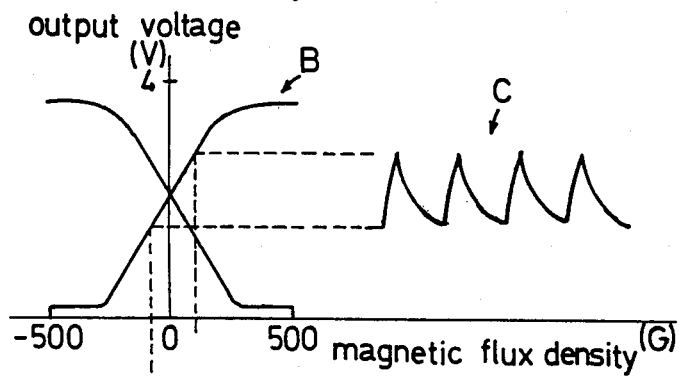
FIG. 10 is a view to explain the operation of a Hall IC used in the detection means of FIG. 9.
Figure 11:
FIG. 11 is a graph showing the relation between the voltage of a command signal and a current flow through a solenoid coil.
Figure 11:
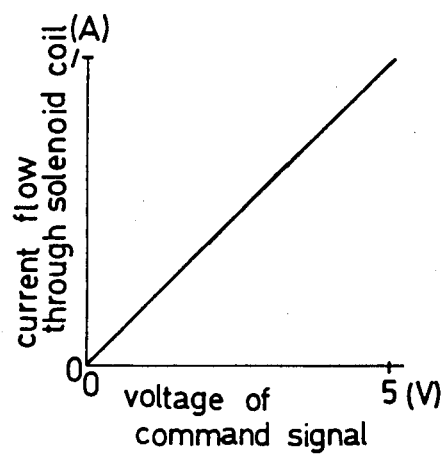

In such an arrangement, the coil 64 is energized in advance to produce a biasing magnetic field. This magnetic field is applied to the Hall IC 29 through the core 62 and yoke 61, thus energizing the coil 16 to produce a magnetic field. Then, this magnetic field is applied to the Hall IC 29 through the core 62 and yoke 61. However, since the Hall IC 29 has been given a biasing magnetic field by the coil 64 in advance, the magnetic field ( A of FIG. 10) applied to the Hall IC 29 by the coil 16 is combined with the straight-line portion of a characteristic curve ( B of FIG. 10) of the Hall IC. Therefore, a signal ( C of FIG. 10) produced in exact proportion to the magnetic field by the coil 16 is sent from Hall IC 29 to the amplifier circuit 30; that is, the Hall IC outputs the signal which is in exact proportion to the value of current flowing through the solenoid coil 13e so that an error of the command signal sent to the amplifier circuit 32 is accurately corrected by the output signal from the Hall IC 29. In consequence, the value of current flow through the solenoid coil 13e is in exact proportion to the voltage of the command signal supplied to the input terminal 19 as indicated by a solid line of FIG. 11. The strength of the magnetic field produced by the coil 64 may be controlled by adjusting the number of windings of the coil wire or the current value, so that the magnetic field by the coil 16 is such as shown in FIG. 10 in relation to the characteristic curve of the Hall IC 29.

Figure 12:
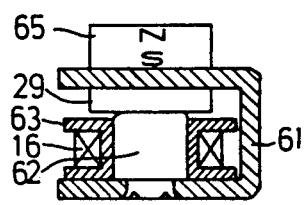
FIG. 12 shows a current-detection means different from that of FIG. 9.

As the means for impressing a biasing magnetic field, such a construction as shown in FIG. 12 may be used instead of that of FIG. 9. In this construction, a permanent magnet 65 for impressing a biasing magnetic field is fixed to the yoke 61 so as to give the Hall IC 29 the same magnetic field as produced by the coil 64. In this construction, portions identical or similar to those of FIG. 9 in function are designated by the same numerals as the preceding ones.

As a control circuit for the arrangement of FIG. 1 or 3 such a construction as shown in FIG. 13 may be used instead of that 14e of FIG. 3. In this construction, a transformer 20f emits such a signal as shown in m of FIG. 14 which is sent to a wave-form modifying circuit 37 comprising a combination of an operational-amplifier circuit 35 and a diode 36. The circuit 37 outputs such a signal as shown in n of FIG. 14 which is sent to an exclusive "or " circuit 38. A portion of the signal n is sent to the circuit 38 through an integration circuit 39 comprising a resistor and diode and a "not" circuit 40. The circuit 38 outputs such a signal as shown in O of FIG. 14 which is sent to a first timer circuit 41. This circuit 41 outputs such a signal as shown in p of FIG. 14 which is sent to a second timer circuit 42. This circuit 42 outputs such a signal as shown in q of FIG. 14. The pulse width $T_1$ of the output signal from the first timer circuit 41 is so set that the pulse is produced for a short period of time equal to one of the serveral equal divisions of the time of one half of the cycle of the AC power 10f. Also, the pulse width $T_2$ of the output signal from the second timer circuit 42 is set at such a value as is smaller than that obtained by subtracting the foregoing pulse width (or time) $T_1$ from the foregoing half-cycle time. The output signal q from the second timer circuit 42 may be supplied to the control terminal (base) 12a of the switching element or transistor 12 of the circuit of FIG. 1 so that the transistor 12 is switched on or off.

Figure 14:
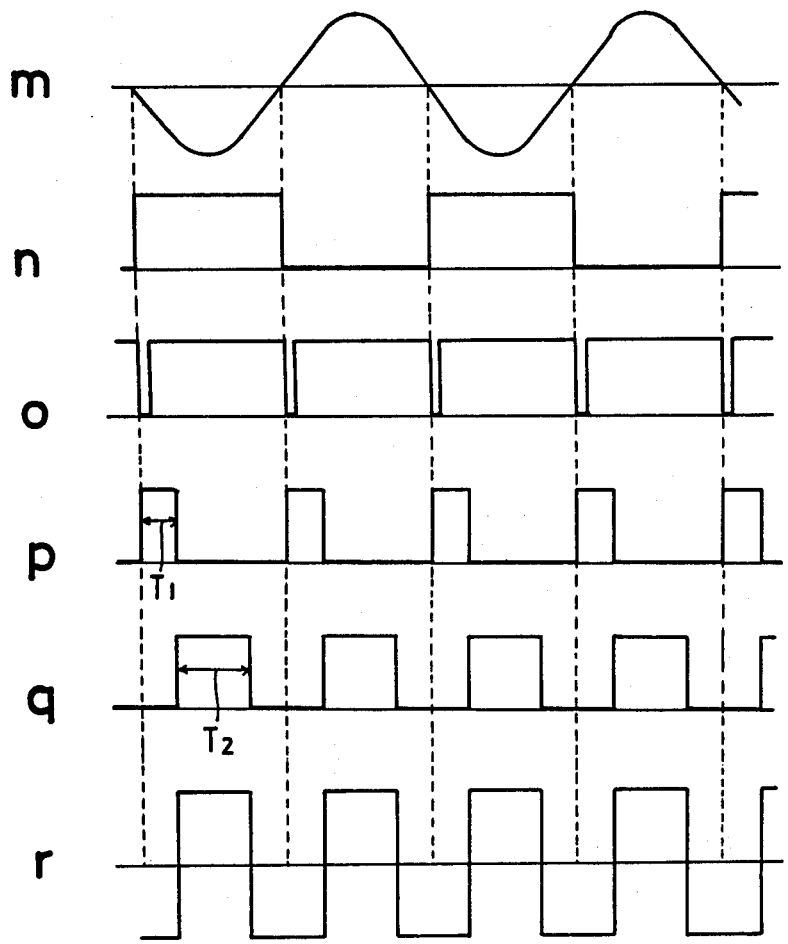
FIG. 14 shows the wave-forms of different signals to explain the operation of the circuit of FIG. 13.

Also, if GTO (gate turn-off thyristor) is employed as the switch element 12, it is an advisable practice to connect the output of the second timer circuit 42 to the plus input terminal of an operational-amplifier circuit 43 which has a minus input terminal connected to a comparison power source, so that the amplifier circuit 43 outputs such a signal as shown in r of FIG. 14 which may be used to control the GTO.

Figure 15:
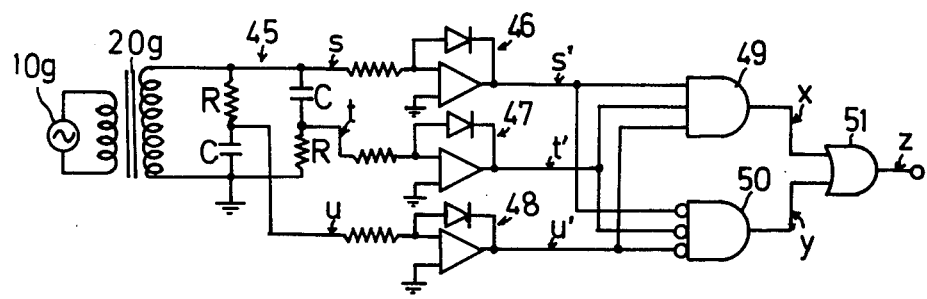
FIG. 15 shows a control circuit different from that of FIG. 13, but which may also be used for the circuit arrangement of FIG. 1 or 3.
Figure 16:
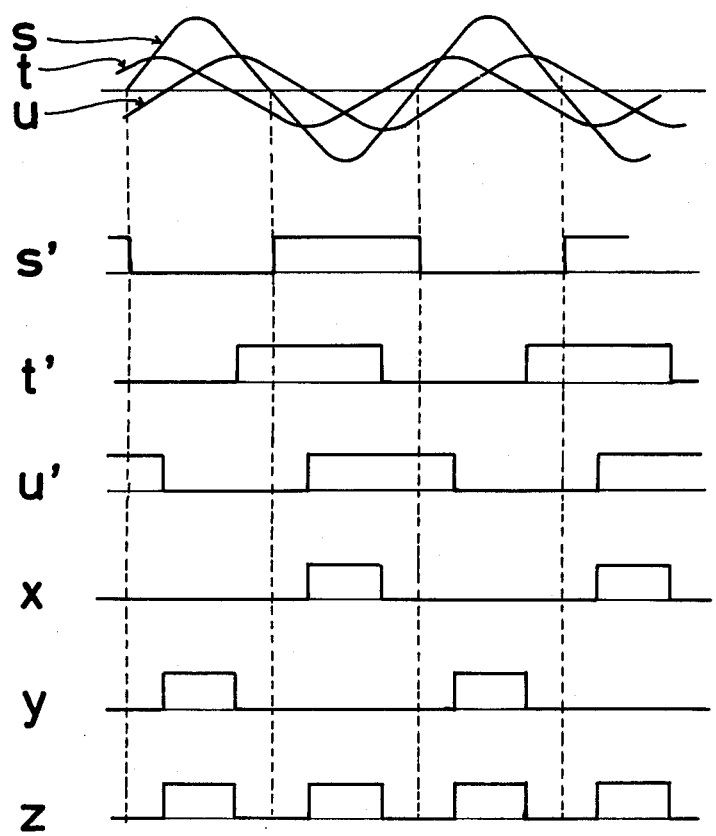
FIG. 16 shows the wave-forms of different signals to explain the circuit of FIG. 15.

As a control circuit for the arrangement of FIG. 1 or 3, such a construction as shown in FIG. 15 may be used instead of that of FIG. 13. In this construction, a transformer 20g supplys a signal to a bridge circuit 45 comprising condensers C and resistors R so that signals s, t, and u (FIG. 16) are produced. The wave-forms of these signals s,t, and u are changed by wave-form modifying circuits 46, 47, and 48 similar to that 37 of FIG. 13, respectively, so that signals s', t', and u' (FIG. 16) are produced. These modified signals are supplied not only to an "and" circuit 49 to produce a signal x, but also to a "nor" circuit 50 to produce a signal y. And the signals x and y are sent to an "or" circuit 51 to provide a signal z. This signal z may be supplied to the control terminal of the switch element 12 of FIG. 1 when a transistor is used as the element 12, so that the transistor is switched on or off.

As many apparently widely different embodiments of this invention may be made without departing from the spirit and scope thereof, it is to be understood that the invention is not limited to the specific embodiments thereof except as defined in the appended claims.

What is claimed is:

1. A method for supplying an AC current to a solenoid coil to operate a movable iron core by an electromagnetic force generated by said solenoid, the method comprising the steps of:
   (a) subjecting a sine wave AC current to full-wave rectification to obtain a pulsating current;
   (b) in a continuous period including a time period before the minimum value of a full-wave rectification waveform of a sine wave and a period after said time, not supplying said full-wave rectified sine wave AC current (pulsating current) to said solenoid coil; and
   (c) in other periods except said continuous period, supplying the full-wave rectified sine wave AC current (pulsating current) to said solenoid coil.

2. A circuit for exciting a solenoid coil which comprises an AC power source, a solenoid coil for operating an iron core, and a circuit provided between and connected to said AC power source and said solenoid coil so as to full-wave rectify the power from said AC power source and supply the rectified power to said solenoid coil and is characterized in further having the following means:
   (a) a switch element provided between and connected to said full-wave rectification circuit and said solenoid coil so as to interrupt the supply of said rectified power to said solenoid coil; and
   (b) a control circuit connected to said switch element wherein in the following period (i), a signal for placing said switch element in a cut-off state is applied to the switch element, and in the following period (ii), a signal for placing said switch element in an energized state is applied to the switch element:
      (i) a continuous period including a period before time at the minimum value of a full-wave rectification waveform of a sine wave and a period after said time, and
      (ii) other periods except said continuous period.

3. A circuit for exciting a solenoid coil which comprises an AC power source, a solenoid coil for operating an iron core, and a circuit provided between and connected to said AC power source and said solenoid coil so as to full-wave rectify the power from said AC power source and supply the rectified power to said solenoid coil and is characterized in further having the following means:
   (a) a switch element provided between and connected to said full-wave rectification circuit and said solenoid coil so as to interrupt the supply of said rectified power to said solenoid coil; and
   (b) a control circuit connected to said switch element wherein in the following period (i), a signal for placing said switch element in a cut-off state is applied to the switch element, and in the following period (ii), a signal for placing said switch element in an energized state is applied to the switch element:
      (i) a continuous period including a period before time at the minimum value of a full-wave rectification waveform of a sine wave and a period after said time, and
      (ii) other periods except said continuous period, wherein said control circuit comprises:

(c) a circuit for full-wave rectify an AC signal from said AC power source;

(d) a first comparison circuit adapted to be not only supplied with a reference of a fixed level in advance, but also supplied with the signal from said rectification circuit (a) so as to compare the two signals with each other and output a signal to make said switch element electrically conductive for each period of time corresponding to the top and its vicinities of the voltage wave-form of said rectified signal;

(e) a circuit for integrating said signal from said first comparison circuit;

(f) an input terminal adapted to be supplied with a command signal; and (g) a second comparison circuit for comparing an output signal from said integration circuit and the command signal from said input terminal and supplying said switch element with a signal to make said switch element electrically conductive only for each period of time corresponding to the value of said command signal during the time of the top and its vicinities of the voltage wave-form of said rectified signal.

4. A solenoid-coil exciting circuit of claim 3 wherein said control circuit further includes a mean-value circuit adapted to be supplied with the output signal from said rectification circuit (a) and supply said first comparison circuit with the signal of average value of said output signal as a reference signal instead of the fixed level signal.

5. A solenoid-coil exciting circuit of claim 3 or 4 further including a transformer located for electrical isolation between said AC power source and said rectification circuit of control circuit and a photoisolator located between said second comparison circuit and said switch element.

6. A solenoid-coil exciting circuit of claim 5 further including a current-detecting coil connected to said solenoid coil in series and a Hall IC magnetically combined with said current-detecting coil, said control circuit further including a circuit located between said second comparison circuit and said command-signal input terminal for correcting said command signal supplied to said second comparison circuit in accordance with an output signal from said Hall IC.

7. A solenoid-coil exciting circuit of claim 6 wherein said Hall IC is provided with a means for impressing a biasing magnetic field.

* * * * *